(12) United States Patent
Shimatsu et al.

(10) Patent No.: US 7,993,762 B2
(45) Date of Patent: Aug. 9, 2011

(54) MAGNETIC THIN FILM AND METHOD OF MANUFACTURING THE SAME, AND VARIOUS APPLICATION DEVICES USING THE SAME

(75) Inventors: Takehito Shimatsu, Sendai (JP); Hideo Sato, Sendai (JP); Osamu Kitakami, Sendai (JP); Satoshi Okamoto, Sendai (JP); Hajime Aoi, Sendai (JP); Hiroyasu Kataoka, Tokyo (JP)

(73) Assignees: Tohoku University, Sendai-shi (JP); Fuji Electric Device Technology Co., Ltd., Tokyo (JP)

( * ) Notice: Subject to any disclaimer, the term of this patent is extended or adjusted under 35 U.S.C. 154(b) by 42 days.

(21) Appl. No.: 12/631,413

(22) Filed: Dec. 4, 2009

(65) Prior Publication Data

US 2010/0140727 A1 Jun. 10, 2010

(30) Foreign Application Priority Data

Dec. 5, 2008 (JP) ................................. 2008-310965

(51) Int. Cl.
H01L 29/82 (2006.01)
C23C 14/35 (2006.01)
G11B 5/65 (2006.01)
G11B 5/39 (2006.01)
C22C 5/04 (2006.01)

(52) U.S. Cl. ...................... 428/692.1; 420/435; 420/466; 148/311; 148/313; 148/315; 204/192.2; 257/421; 428/811.1; 428/812; 428/836.1

(58) Field of Classification Search .......................... None
See application file for complete search history.

(56) References Cited

U.S. PATENT DOCUMENTS

| 6,541,131 B1 * | 4/2003 | Ristau ........................... 428/826 |
| 6,641,934 B1 | 11/2003 | Suzuki et al. |
| 2002/0098383 A1 | 7/2002 | Maeda et al. |
| 2003/0118867 A1 | 6/2003 | Koda et al. |
| 2003/0215675 A1 | 11/2003 | Inaba et al. |
| 2004/0196593 A1 | 10/2004 | Yasui et al. |
| 2005/0100765 A1 | 5/2005 | Mukai |
| 2006/0188743 A1 | 8/2006 | Seki et al. |
| 2007/0160824 A1 * | 7/2007 | Ichihara et al. ............ 428/304.4 |
| 2010/0055503 A1 * | 3/2010 | Shimatsu et al. .......... 428/836.1 |

(Continued)

FOREIGN PATENT DOCUMENTS

JP  2001-101645  4/2001

(Continued)

OTHER PUBLICATIONS

IDS reference Sato, H., Shimatsu, T., Okazaki, Y., Muraoka, H., Aoi, H., Okamoto S., and Kitakami, O., J. App. Phys., 103, 07E114, 2008.*

(Continued)

*Primary Examiner* — Kevin M Bernatz
(74) *Attorney, Agent, or Firm* — Venable LLP; Michael A. Sartori

(57) ABSTRACT

The present invention relates to a magnetic thin film containing a $L1_1$ type Co—Pt—C alloy in which atoms are orderly arranged, and can realize an order degree excellent in regard to the $L1_1$ type Co—Pt—C alloy to achieve excellent magnetic anisotropy of the magnetic thin film. Therefore, in the various application devices using the magnetic thin film, it is possible to achieve a large capacity process and/or a high density process thereof in a high level.

12 Claims, 4 Drawing Sheets

U.S. PATENT DOCUMENTS

2011/0020669 A1* 1/2011 Sayama et al. ................ 428/831

FOREIGN PATENT DOCUMENTS

| JP | 2002-208129 | 7/2002 |
|---|---|---|
| JP | 2002-216330 | 8/2002 |
| JP | 2003-173511 | 6/2003 |
| JP | 2004-311607 | 11/2004 |
| JP | 2004-311925 | 11/2004 |
| JP | 2005-333106 | 12/2005 |
| JP | 2006-85825 | 3/2006 |
| WO | WO 2004/034385 A1 | 4/2004 |

OTHER PUBLICATIONS

IDS reference Yamaguchi, H., Kitakami, O., Okamoto, S., Shimada, Y., Oikawa, K., and Fukamichi, K., App. Phys. Let., 79(13), pp. 2001-2003, Sep. 2001.*

IDS reference Ko, H., Perumal, A., and Shin, S., App. Phys. Let., 82(14), 2311-2313, Apr. 2003.*

Kim., T., Cadeville, M., Dinia, A., and Rakoto, H., J. App. Phys., 81(8), 5273-5275, 1997.*

Sato, H., Shimatsu, T., Kataoka, H., Aoi, H., Okamoto, S., and Kitakami, O., J. App. Phys., 105, 07B726, 2009.*

Nakahigashi, K., and Shinoya, Y., Jap. Journ. Appl. Phys., 22(12), 1790-1793, 1983.*

Sato et al., "Fabrication of $L1_1$ type Co-Pt ordered alloy films by sputter deposition", Journal of Applied Physics, vol. 103, 07E114-1-07E114-3 (2008).

Okamoto et al., "Chemical-order-dependent magnetic anisotropy and exchange stiffness constant of Fe-Pt (001) epitaxial films", Physical Review B, 66, 024413-1-024413-9 (2002).

Ko et al., "Fine control of $L1_0$ ordering and grain growth kinetics by C doping in FePt films", Applied Physics Letters, vol. 82, No. 14, pp. 2311-2313 (2003).

Yamaguchi et al., "Effects of B and C on the ordering of $L1_0$-CoPt thin films", Applied Physics Letters, vol. 79, No. 13, pp. 2001-2003 (2001).

Sato et al., "Fabrication of L1, type (Co-Ni)-Pt ordered alloy films by sputter deposition for bit-patterned media", outline collection, 32th Japanese magnetics association science lecture meeting (2008).

* cited by examiner

MAGNETIC THIN FILM AND METHOD OF MANUFACTURING THE SAME, AND VARIOUS APPLICATION DEVICES USING THE SAME

This application claims the benefit of Japanese Patent Application No. 2008-310965, filed Dec. 5, 2008, which is hereby incorporated by reference herein in its entirety.

BACKGROUND OF THE INVENTION

1. Field of the Invention

The present invention relates to a magnetic thin film containing an alloy of a $L1_1$ type atom ordered structure. In more detail, the present invention relates to a magnetic thin film achieving a magnetic characteristic excellent due to the structure. The present invention relates to a method of manufacturing such magnetic thin film, and various application devices using the magnetic thin film.

2. Description of the Related Art

Various devices using a magnetic thin film include a magnetic recording medium, a tunnel magnetic resistive element (TMR), a magnetic resistive random access memory (MRAM), a micro-electromechanical system (MEMS) device, and the like.

First, the magnetic recording medium will be described as an example of the various devices using the magnetic thin film. The magnetic thin film is used in a magnetic recording device such as a hard disc, an optical magnetic record (MO), and a magnetic tape, and the magnetic recording system includes an in-plane magnetic recording system and a perpendicular magnetic recording system.

The in-plane recording system is the conventional system, for example, a system for carrying out a magnetic record horizontal to a hard disc surface. However, in recent years, there is mainly used the perpendicular magnetic recording system which can achieve a higher record density by carrying out the magnetic record perpendicular to the disc surface. Various studies have been made on a medium (perpendicular magnetic recording medium) to which the perpendicular magnetic recording system is applied, and for example, the following technology is disclosed.

Japanese Patent Laid-Open No. 2006-85825 discloses a perpendicular magnetic recording medium provided with a granular structure where at least an under layer, a magnetic layer and a protective layer are sequentially formed on a substrate, wherein the magnetic layer comprises ferromagnetic crystal grains composed essentially of a Co—Pt alloy and non-magnetic grain boundaries composed essentially of an oxide surrounding the crystal grains, and wherein the under layer comprises an alloy of two or more elements of any of Cu, Pd and Au or any of Cu, Pd, Pt, Ir and Au. The perpendicular magnetic recording medium has excellent low noise characteristics, thermal stability and writing characteristics, and is capable of performing high density recording and being manufactured at a low cost.

At present a crystalline film of a Co—Pt alloy is mainly used in the magnetic layer of the perpendicular magnetic recording medium. The crystalline film of the Co—Pt alloy has a crystal orientation so controlled that a C axis of a Co—Pt alloy with a hexagonal closest packed structure (hcp) is perpendicular to a film plane (that is, C plane is parallel to the film plane), thereby enabling the perpendicular magnetic recording.

As one system for controlling magnetic characteristics of the magnetic layer, there is known a system for forming a granular magnetic layer having a structure of surrounding a periphery of the ferromagnetic crystal grains by a non-magnetic and non-metallic substance such as an oxide and a nitride.

In the granular magnetic layer, the grain boundary phase of the non-magnetic and non-metallic substance physically separates the ferromagnetic grains. Therefore, since a transition region of recording bits is narrowed without excessively increasing a magnetic mutual operation between the ferromagnetic grains to restrict the fluctuation, low noise characteristics can be obtained.

In recent years, in order to reduce a magnetic influence with each other between adjacent tracks for the purpose of realizing a higher recording density in the perpendicular magnetic recording medium, development of discrete track media (DTM) where a groove is formed between the tracks has been actively made. In addition, for enabling recording of one bit per one magnetic dot (or one magnetic grain), development of bit pattern media (BPM) where magnetic dots (or magnetic grains) are also artificially orderly lined up has been actively made.

Further, for obtaining a perpendicular magnetic recording medium capable of carrying out recording on a magnetic film having a high holding magnetic force, there is proposed a thermal assist magnetic recording (HAMR or TAMR) system, an energy assist recording system (MAMR) by a micro wave, or the like, and studies on the magnetic recording medium using these recording systems also have been actively made.

Next, a tunnel magnetic resistive element (TMR) as another example of various devices to which the magnetic thin film is applied and a magnetic resistive random access memory (MRAM) using the tunnel magnetic resistive element will be described. The conventional memory such as a flash memory and a dynamic random access memory (DRAM) records information using electrons in the memory cell, but MRAM is a memory using the same magnetic element as the hard disc in a recording medium.

MRAM has address access time of about 10 ns and cycle time of about 20 ns. Therefore, reading and writing by MRAM can be made at a high speed about five times the speed of DRAM, that is, substantially the same as a static random access memory (SRAM). In addition, MRAM has an advantage that low consumption power of about $\frac{1}{10}$ of the flash memory and high cumulative performance can be realized.

Here, TMR used in MRAM can be constructed, for example, of a laminated element in which a ferromagnetic thin film is formed on an anti-ferromagnetic thin film, and various technologies are disclosed in relation thereto.

Japanese Patent Laid-Open No. 2005-333106 discloses an exchange-coupled element in which an anti-ferromagnetic layer and a ferromagnetic layer exchange-coupled to the anti-ferromagnetic layer are sequentially laminated on a substrate, and the anti-ferromagnetic layer has an order phase of a Mn—Ir alloy ($Mn_3Ir$). FIG. 5 in this document discloses a schematic cross section of TMR. FIG. 4 in this document discloses a spin valve type magnetic resistive element equipped with the exchange coupled element, and this element is also a laminated element in which a ferromagnetic thin film is formed on an anti-ferromagnetic thin film in the same way as TMR described above.

Further, a micro electromechanical system (MEMS) device will be described as another example of the various devices to which the magnetic thin film is applied. The MEMS device is a generic name of a device in which mechanical element components, sensors, actuators, and/or electronic circuits are integrated on one silicon substrate, one glass substrate, one organic material or the like. Application examples of the MEMS device may include a digital micro mirror device (DMD) which is one kind of an optical element in a projector, a micro nozzle used in a head portion of an ink jet printer, various sensors such as a pressure sensor, an acceleration sensor and a flow sensor, and the like. These devices will hopefully be applied to not only manufacturing industries but also a medical field.

In any of the various devices (magnetic recording medium, TMR, MRAM, and MEMS device) to which the magnetic thin film is applied shown above, an improvement on magnetic characteristics of the magnetic thin film, specially the uniaxial magnetic anisotropy (Ku) is demanding. Development of the magnetic thin film showing such an excellent Ku value is considered to contribute greatly to a large capacity process and/or a high density process of a recording medium and a memory.

For example, as a magnetic recording layer of the perpendicular magnetic recording medium, a recording layer equipped with grains or dots having a structure in which a hard magnetic layer and a soft magnetic layer are laminated, such as an ECC (exchange coupled composite), a hard/soft stack and an exchange spring is proposed as means for achieving the high density process.

However, for sufficiently effecting characteristics of these media to realize high thermal stability and excellent saturation recording characteristics, it is necessary to use the perpendicular magnetization film showing a large Ku value of the order of $10^7$ erg/cm$^3$ in the hard magnetic layer.

In addition, also in MRAM of a spin injection magnetization reverse type expected as the future high density memory, there have been made studies on realization of a large capacity process by using the perpendicular magnetization film showing a large Ku value of the order of $10^7$ erg/cm$^3$.

There have been made various studies on the perpendicular magnetization film showing a Ku value suitable for being used in such a magnetic recording medium and memory, and for example, the following technology is disclosed.

In H. Sato, et al., "Fabrication of $L1_1$ type Co—Pt ordered alloy films by sputter deposition", J. Appl. Phys., 103, 07E114 (2008), manufacture of $L1_1$ type Co—Pt ordered alloy films by sputter deposition is disclosed. In addition, in S. Okamoto et al., "Chemical order-dependent magnetic anisotropy and exchange stiffness constant of Fe—Pt (001) epitaxial films", Phys. Rev. B, 66, 024413 (2002) and Japanese Patent Laid-Open No. 2004-311925, $L1_0$ type Fe—Pt ordered alloy films are disclosed. Further, in Japanese Patent Laid-Open No. 2002-208129, Japanese Patent Laid-Open No. 2003-173511, Japanese Patent Laid-Open No. 2002-216330, Japanese Patent Laid-Open No. 2004-311607, Japanese Patent Laid-Open No. 2001-101645, and Patent Publication No. WO2004/034385, $L1_0$ type Fe—Pt ordered alloys such as a Fe—Pt ordered alloy, a Fe—Pd ordered alloy and a Co—Pt ordered alloy, and a magnetic recording medium using this as a magnetic layer are disclosed. It should be noted that the $L1_1$ type Co—Pt ordered alloy films disclosed in H. Sato, et al., "Fabrication of $L1_1$ type Co—Pt ordered alloy films by sputter deposition", J. Appl. Phys., 103, 07E114 (2008) can realize a much larger order degree as compared to the conventional alloy film, which is therefore expected to show a remarkably large Ku value.

However, under recent situations in need of a large capacity process and a high density process of various devices, it is desired to develop a perpendicular magnetic recording layer (magnetic thin film) having uniaxial magnetic anisotropy in size equal to or more than any magnetic thin film disclosed in the above documents and capable of being formed by a simpler manufacturing technology.

Accordingly, an object of the present invention is to provide a magnetic thin film having large uniaxial magnetic anisotropy, a method of manufacturing the magnetic thin film, and various application devices using the magnetic thin film.

SUMMARY OF THE INVENTION

The present invention relates to a magnetic thin film containing a $L1_1$ type Co—Pt—C ordered alloy in which atoms are orderly arranged. The magnetic thin film of the present invention can be applied to various devices such as magnetic recording medium.

In such a magnetic thin film, it is preferable that the magnetic thin film contains C of 50 vol % or less.

At least one of metallic elements other than Co and Pt may be contained in the above Co—Pt—C alloy. Further, the magnetic thin film may be formed of a granular structure having non-magnetic grain boundaries. It is preferable that in the magnetic thin film described above, an easy axis of magnetization is oriented perpendicular to a film plane.

Next, the present invention relates to a method of manufacturing a magnetic thin film in which, for manufacturing the magnetic thin film on a substrate, a temperature of the substrate is set to 150 to 500° C., and the magnetic thin film is formed by a highly vacuumed magnetron sputter method in which a vacuum degree prior to film forming is equal to or less than $1 \times 10^{-4}$ Pa. In this manufacturing method, it is preferable that the substrate temperature is in a range of 270 to 400° C. and it is preferable that the vacuum degree is equal to or less than $7 \times 10^{-7}$ Pa.

Further, the present invention includes a perpendicular magnetic recording medium, a tunnel magnetic resistive element, a magnetic resistive random access memory, and a micro electromechanical system device each equipped with the above magnetic thin film.

The magnetic thin film of the present invention can realize an order degree excellent in regard to the $L1_1$ type Co—Pt—C alloy by the above construction to achieve excellent magnetic anisotropy of the magnetic thin film. Therefore, in the various devices using the magnetic thin film, it is possible to achieve a large capacity process and/or a high density process in a high level.

Further features of the present invention will become apparent from the following description of exemplary embodiments (with reference to the attached drawings).

DESCRIPTION OF THE EMBODIMENTS

Figure 1A:
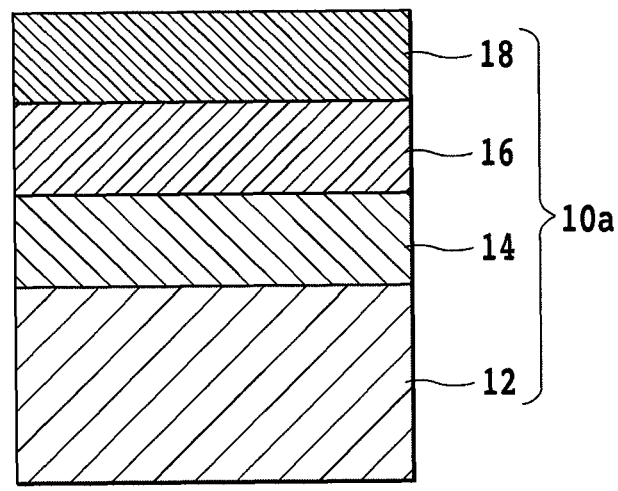
FIG. 1A is a cross section showing an example of a perpendicular magnetic recording medium formed using a magnetic thin film according to the present invention, and shows a perpendicular magnetic recording element 10a, wherein an under layer 14, a magnetic layer 16, and a protective layer 18 are sequentially formed on a substrate 12.

<Magnetic Thin Film (and Manufacturing Method Thereof)>

Hereinafter, a magnetic thin film of the present invention will be explained together with the manufacturing method. It should be noted that an example shown as follows means just an example of the present invention and can be modified in design as needed by persons skilled in the art.

The magnetic thin film of the present invention comprises a magnetic thin film containing an $L1_1$ type Co—Pt—C alloy in which atoms are orderly arranged.

Here, "$L1_1$ type" in the present invention means a crystal structure in which closest-packed planes of two types of atoms having compositions different from each other are alternately laminated in a face-centered cubic lattice.

The magnetic thin film preferably contains C of 50 vol % or less, preferably C of 2 to 30 vol %, and furthermore preferably C of 1 to 30 vol %. When the lower limit value is thus set to 1 vol % or more, an $L1_1$ type Co—Pt—C alloy film high in magnetic continuity, which is high in atomic order degree and Ku value, and also restricts precipitation of C into crystal grain boundaries, can be formed. On the other hand, when the upper limit value is thus set to 30 vol % or less, a granular film of an $L1_1$ type Co—Pt—C alloy with a high grain volumetric efficiency, in which grains are separated while a large Ku value is maintained, can be obtained.

The Co—Pt—C alloy contains Co, Pt, and C as essential elements, and further, may contain at least one kind of metallic elements other than Co and Pt. For example, this alloy may selectively contain metallic elements such as Ni, Fe, Mn, Cr, V, Ti, Sc, Cu, Zn, Pd, Rh, Ru, Mo, Nb, Zr, Ag, Ir, Au, Re, W, Ta, Hf, Al, Si, Ge, and B arbitrarily.

Particularly the C content in the Co—Pt—C alloy is preferably in a range of 2 to 5 vol %. Thereby, in a case where a magnetic thin film is formed on a glass substrate, a value of uniaxial magnetic anisotropy (Ku) of the formed magnetic thin film containing the $L1_1$ type Co—Pt—C alloy of the poly crystal is closest to a Ku value of the magnetic thin film containing the $L1_1$ type Co—Pt alloy of the single crystal formed on a surface of (111) crystal plane of a MgO single crystal substrate. This is because where the order degree of the atomic arrangement of the $L1_1$ type Co—Pt alloy of the poly crystal is lower as compared to that of the $L1_1$ type Co—Pt alloy of the single crystal, the Ku value can be increased by a large margin by adding C to the above alloy of the poly crystal, and is very important in view of formation of a magnetic film used in various devices.

Further, even if the C content in the Co—Pt—C alloy is increased from 2 to 5 vol % to 30 vol %, the $L1_1$ type Co—Pt—C alloy of the poly crystal can be obtained. Therefore, a granular film showing a high Ku value used in energy assist or the like can be possibly obtained by forming a grain boundary phase made mainly of non-magnetic C based upon controlling a structure of a Co—Pt—C alloy thin film in this composition region.

Such a magnetic thin film can be formed of a granular film by interposing a non-magnetic substance other than the grain boundary phase made mainly of the non-magnetic C or the like between crystal grains of the Co—Pt—C alloy.

An example of the non-magnetic substance used for forming the granular film includes $SiO_2$, $Cr_2O_3$, $ZrO_2$, and $Al_2O_3$ each of which is high in performance of magnetically separating crystal grains of the Co—Pt—C alloy. Among them, $SiO_2$ is preferable in a point that the performance of magnetically separating the crystal grains of the Co—Pt—C alloy is excellent. The non-magnetic substance used for forming the granular film may be of an $L1_1$ type ordered structure or may be of the other type structure.

In any of the magnetic thin films described above, an easy axis of magnetization is preferably oriented perpendicular to the film plane. Here, the axis of easy magnetization means a crystal orientation in which the magnetic thin film having the crystal magnetic anisotropy is likely to be easily magnetized. It can be checked by measuring a crystal orientation with X ray diffraction or the like whether or not the easy axis of magnetization is oriented perpendicular to the film plane.

Next, such a magnetic thin film can be obtained in such a manner that a temperature of the substrate on which the magnetic thin film is laminated is made to 150 to 500° C. and the magnetic thin film is formed using a highly vacuumed magnetron sputter method in which a vacuum degree prior to film forming is equal to or less than $1 \times 10^{-4}$ Pa.

The substrate is not particularly limited as long as the magnetic thin film can be laminated, and if necessary, respective layers further laminated thereon are suitably sequentially formed. For example, a glass substrate, a Si substrate and the like may be used as the substrate.

The reason for using the magnetron sputter method, particularly the high vacuum magnetron sputter method is to promote formation of the $L1_1$ type ordered structure by a film forming technology suitable for mass production.

A heating temperature of the substrate upon forming the magnetic thin film is preferably in a range of 150 to 500° C. When the heating temperature is made to 150° C. or more, formation of the $L1_1$ type ordered structure can be promoted, and on the other hand, when the heating temperature is made to 500° C. or less, disturbance of the $L1_1$ type ordered structure can be restricted. When the heating temperature is made to 270 to 400° C., the above effect can be achieved at an extremely high level.

It is preferable in view of promoting the $L1_1$ type ordered structure that the vacuum degree upon forming the magnetic thin film is made equal to or less than $1 \times 10^{-4}$ Pa. It is more preferable in view of achieving the above effect at a high level that the vacuum degree upon forming the magnetic thin film is made equal to or less than $7 \times 10^{-7}$ Pa.

<Various Application Devices Using Magnetic Thin Film>

Next, various application devices using the aforementioned magnetic thin film will be explained. It should be noted that the following example is just an example according to the present invention and can be changed in design as needed by persons skilled in the art.

[Magnetic Recording Medium]

Figure 1B:
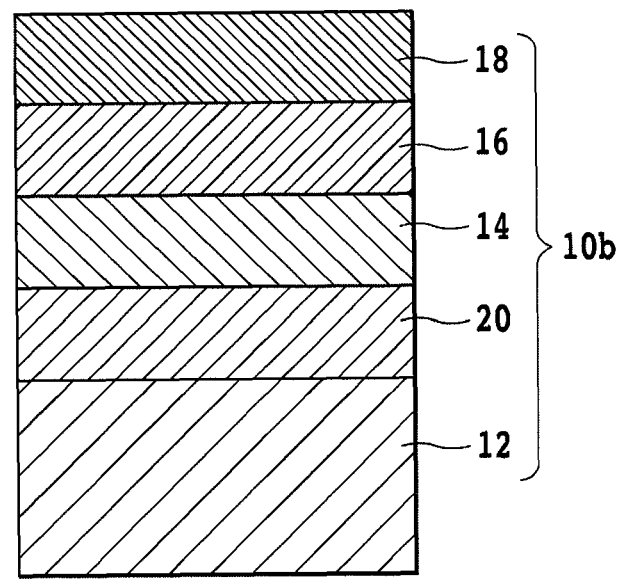
FIG. 1B is a cross section showing an example of a perpendicular magnetic recording medium formed using a magnetic thin film according to the present invention, and shows a perpendicular magnetic recording element 10b, wherein seed layer 20 is further formed between the substrate 12 and the under layer 14 in the example shown in FIG. 1A.

FIG. 1A and FIG. 1B are cross sections showing two examples each showing the perpendicular magnetic recording medium formed using the magnetic thin film, and FIG. 1A shows a perpendicular magnetic recording medium 10a wherein an under layer 14, a magnetic layer 16, and a protective layer 18 are sequentially formed on a substrate 12, and FIG. 1B shows a perpendicular magnetic recording medium 10b in which a seed layer 20 is further formed between the substrate 12 and the under layer 14 for the purpose of suitably controlling the excellent crystal orientation and/or the excellent crystal grain diameter of the under layer 14.

(Substrate 12)

The Substrate 12 is a Construction Element Arranged at the lowest section of each of the perpendicular magnetic recording media 10 a and 10b for supporting the other construction elements 14 to 20, which will be described later, sequentially formed thereon. The substrate 12 may be formed not only of an Al alloy plated with NiP, reinforced glass and crystallized glass which are used in a usual magnetic recording medium, but also of a silicon substrate.

(Under Layer 14)

The under layer 14 is a construction element arranged for improving orientation of the magnetic layer 16, controlling a grain diameter of the layer 16, and further restricting generation of an initial growth layer at the time of forming the layer 16. It is preferable to use a material having a hcp structure, such as Ru, Re, Ti, Zr, Nd, Tm, and Hf so that the under layer 14 can sufficiently achieve such a role.

(Magnetic Layer 16)

The magnetic layer 16 is a construction element arranged for recording information. The magnetic layer 16 is a single layer element or a laminated layer structure having two or more layers. In a case of the laminated layer structure, the magnetic thin film can be applied to at least one layer thereof, and the construction and the manufacturing method have been in detail described in the chapter of the magnetic thin film, and therefore, are omitted.

(Protective Layer 18)

The protective layer 18 is a construction element arranged for protecting respective layers 12 to 16 and 20 positioned under the layer 18 in a cross-sectional view of the magnetic recording medium 10 in each of FIG. 1A and FIG. 1B, and in a case where the magnetic layer 16 is a granular layer, for preventing elution of Co from the magnetic layer 16. The protective layer 18 may be formed of a material usually used in the perpendicular magnetic recording medium. For example, the protective layer 18 may be a protective layer made mainly of carbon such as diamond-like carbon (DLC) or amorphous carbon (preferably diamond-like carbon (DLC)) or formed of various types of thin layer materials which are known to be used as a protective layer of the magnetic recording medium. A thickness of the protective layer 18 may be made equal to that usually used as the construction element of the perpendicular magnetic recording medium.

(Seed Layer 20)

In the perpendicular magnetic recording medium 10b in FIG. 1B, a seed layer 20 is further formed between the substrate 12 and the under layer 14. The seed layer 20 is a construction element for suitably controlling orientation of the under layer 14 formed as an upper layer of the seed layer 20, finally achieving good perpendicular orientation of the magnetic layer 16.

(Other Layer)

Further, in the perpendicular magnetic recording media 10a and 10b shown in FIG. 1A and FIG. 1B, layers other than the respective layers 12 to 20 disclosed in these figures can be included.

For example, a soft magnetic underlayer (not shown) can be formed on the substrate 12. The soft magneticunderlayer is a construction element sufficiently securing a magnetic filed in a perpendicular direction for preventing spread of magnetic flux generated from a head at the time of recording information. An example of a material of the soft magnetic underlayer may include a Ni alloy, a Fe alloy, and a Co alloy. In particular, by using Co—Zr—Nb, Co—Ta—Zr, Co—Ta—Zr—Nb, Co—Fe—Nb, Co—Fe—Zr—Nb, Co—Ni—Fe—Zr—Nb, Co—Fe—Ta—Zr—Nb and the like of an amorphous material as the material of the soft magnetic underlayer, good recording performance can be obtained.

The under layer 14, the magnetic layer 16, the protective layer 18, the seed layer 20 and the other layer such as the soft magnetic underlayer as described above can be formed using an arbitrary method and condition known in the corresponding technology, such as a sputter method (including a DC magnetron sputter method, a RF magnetron sputter method and the like) and a vacuum vapor deposition method.

In addition, a lubricating layer (not shown) may be formed on the protective layer 18. The lubricating layer is an arbitrary layer, but a liquid construction element arranged for reducing a friction force generated between the protective layer 18 and a head not shown in FIG. 1A and FIG. 1B to obtain excellent durability and reliability of the magnetic recording medium 10. An example of a material of the lubricating layer may include a material usually used in the magnetic recording medium. For example, a perfluoro polyether lubricating agent can be used as the material of the lubricating layer. A film thickness of the lubricating layer may be made equal to that usually used in the construction element of the perpendicular magnetic recording medium. The lubricating layer may be formed using an arbitrary coating method known in the corresponding technology, such as a dip coating method and a spin coating method.

[Tunnel Magnetic Resistive Element (TMR) and Magnetic Resistive Random Access Memory (MRAM)]

Figure 2A:
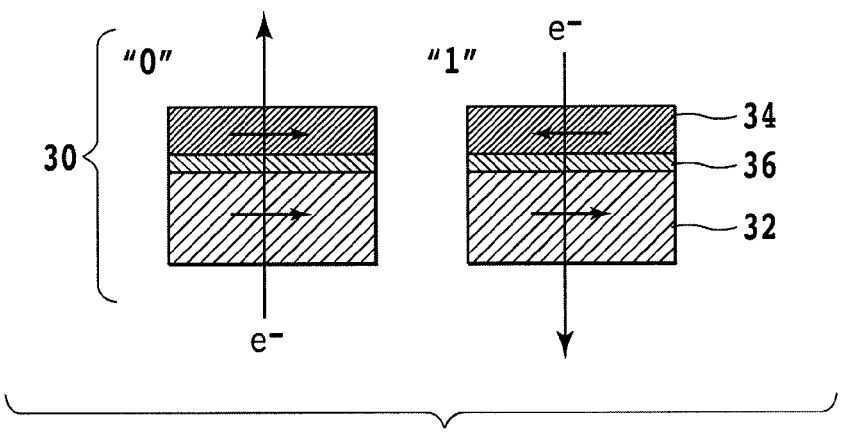
FIG. 2A is a cross section showing a tunnel magnetic resistive element formed using the magnetic thin film according to the present invention.
Figure 2B:
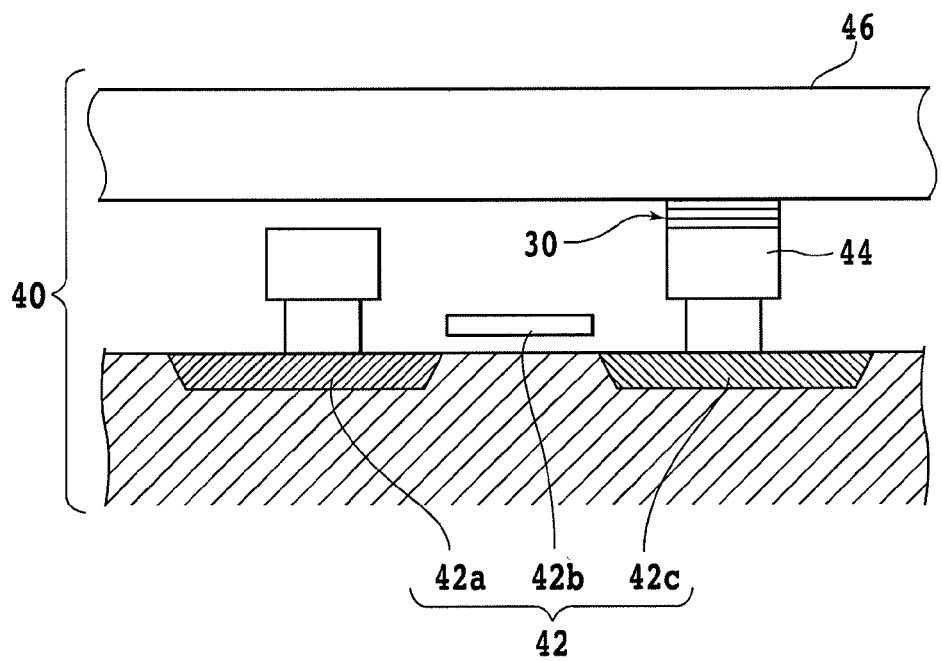
FIG. 2B is a cross section showing a magnetic resistive random access memory formed using the tunnel magnetic resistive element shown in FIG. 2A.
Figure 3A:
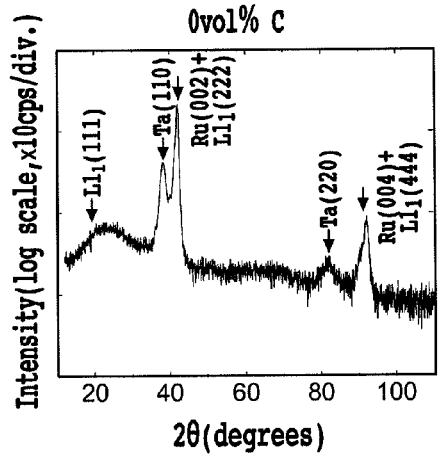
FIG. 3A is a graph showing a X ray diffraction pattern in a perpendicular magnetic recording medium, and shows a medium in Example 1.
Figure 3B:
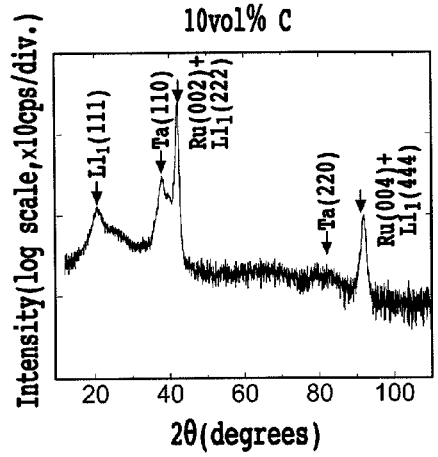
FIG. 3B is a graph showing a X ray diffraction pattern in a perpendicular magnetic recording medium, and shows a medium in Example 2.
Figure 3C:
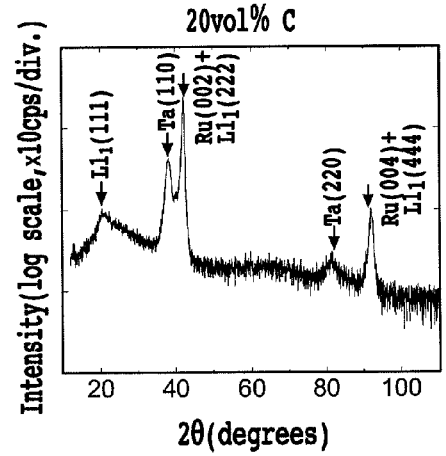
FIG. 3C is a graph showing a X ray diffraction pattern in a perpendicular magnetic recording medium, and shows a medium in Example 3.
Figure 3D:
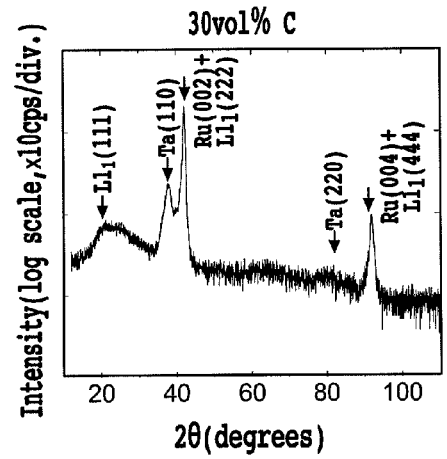
FIG. 3D is a graph showing a X ray diffraction pattern in a perpendicular magnetic recording medium, and shows a medium in Example 4.

FIG. 2A is across section showing a tunnel magnetic resistive element according to the present invention formed using the above magnetic thin film. FIG. 2B is a cross section showing a magnetic resistive random access memory formed using the tunnel magnetic resistive element shown in FIG. 2A.

As shown in FIG. 2A, a tunnel magnetic resistive element 30 according to the present invention is a laminated element in which a pinned magnetic layer 32, a barrier layer 36, and a free magnetic layer 34 are sequentially formed.

The free magnetic layer 34 is a construction element which can change an orientation of magnetization by current flowing in the tunnel magnetic resistive element 30 or a magnetic field given from outside.

The barrier layer 36 is a construction element for arranging a barrier flowing tunnel current between the free magnetic layer 34 and the pinned magnetic film 32. The barrier layer 36 can be formed using an oxide thin film such as magnesium oxide (MgO) and aluminum oxide ($Al_2O_3$). The barrier layer can be formed using an arbitrary method and condition known in the corresponding technology, such as a sputter method (including a DC magnetron sputter method, a RF magnetron sputter method and the like) and a vacuum vapor deposition method.

The pinned magnetic layer 32 is a construction element arranged as a magnetic layer in which an orientation of the magnetization does not change even if current or an external magnetic field is applied to the tunnel magnetic resistive element 30. A difference in orientation of magnetization between the pinned magnetic layer 32 and the free magnetic layer 34 can change a magnitude of tunnel current flowing in the barrier layer 36.

The magnetic thin film can be used in at least one of the pinned magnetic layer 32 and the free magnetic layer 34. The construction and the method have been in detail described in the chapter of the magnetic thin film and therefore, are herein omitted.

The tunnel magnetic resistive element 30 with such a structure operates by changing an orientation of magnetization of the free magnetic layer 34 with the current or the external magnetic field supplied to the same element 30. Specially the tunnel magnetic resistive element 30 is, as shown In FIG. 2A, operated by reversibly changing a parallel state (left side in the figure) in orientation of magnetization between the pinned magnetic layer 32 and the free magnetic layer 34 into an opposing parallel state (right side in the figure) in orientation of magnetization between the pinned magnetic layer 32 and the free magnetic layer 34.

The orientations in magnetization of the pinned magnetic layer 32 and the free magnetic layer 34 may be, as shown in FIG. 2A, in a parallel state or an opposing parallel state in an in-plane direction of the two layers 32 and 34 or each orientation in magnetization of the pinned magnetic layer 32 and the free magnetic layer 34 may be in a parallel state or an opposing parallel state with each other in a direction perpendicular to the two layers 32 and 34. Further, "0" and "1" shown in the figure each means 0 and 1 of a signal in a case of using the tunnel magnetic resistive element 30 as a memory.

Next, as shown in FIG. 2B, the magnetic resistive element 30 may be incorporated in the magnetic resistive random access memory 40 for use. As shown in the figure, the magnetic resistive random access memory 40 is provided with a MOS-FET 42 having a source 42a, a gate 42b, and a drain 42c, the magnetic resistive element 30 connected through a contact 44 to the MOS-FET 42, and bit lines 46 formed above it.

The magnetic resistive random access memory 40 shown in FIG. 2B can be formed using any known technology.

The magnetic resistive random access memory 40 with such a construction can serve as a memory for storing digital information by the above function of the magnetic resistive element 30 based upon the construction shown in FIG. 2B.

[Other Device]

An example of the other application device using the magnetic thin film according to the present invention includes a micro electromechanical system (MEMS) device (not shown). The micro electromechanical system device can be formed by any known technology by incorporating the above magnetic thin film into a given member.

EXAMPLE

Hereinafter, the effect of the present invention will be exemplified by examples. It should be noted that the following examples are just representative examples for explaining the present invention, and do not limit the present invention at all.

<Formation of Magnetic Recording Medium>

Example 1

A magnetic recording medium was produced using a DC magnetron sputter device (ANELVAE 8001) for ultra high vacuum (UHV).

A glass disc having a diameter of 2.5 inches was prepared as a substrate, a Ta layer of 5 nm was formed on the substrate, and a Ru under layer of 20 nm was formed thereon.

Next, the ultimate vacuum was set to $7 \times 10^{-7}$ Pa or less, an ultra-purity argon gas having an impurity density of 2 to 3 ppb was used, and a temperature of a glass substrate was set as 360° C. to form 10 nm of a Co—Pt—C alloy (C content: 0 vol %) on the Ru under layer by the co-sputter method. It should be noted that in this sputter method, each film-forming speed of Co, Pt, and C was set to 1.4 to 4.7 nm/min. The each film-forming speed depends on a composition of a desired film-forming alloy or the like.

Further, 2 nm of a Pt cap layer was formed on a Co—Pt—C alloy to obtain a perpendicular magnetic recording medium of Example 1.

Example 2

Except that the C content was set to 10 vol %, a perpendicular magnetic recording medium in Example 2 was obtained in the same way as in Example 1.

Example 3

Except that the C content was set to 20 vol %, a perpendicular magnetic recording medium in Example 3 was obtained in the same way as in Example 1.

Example 4

Except that the C content was set to 30 vol %, a perpendicular magnetic recording medium in Example 4 was obtained in the same way as in Example 1.

<Evaluation Item>

In regard to each perpendicular magnetic recording medium of Example 1 to Example 4, confirmation of a $L1_1$ type ordered structure was conducted by observing a super lattice diffraction in X ray diffraction pattern. In addition, in regard to each perpendicular magnetic recording medium of Example 1 to Example 4, the saturation magnetization (Ms) was found by a VSM (vibration sample magnetometer). Further, in regard to each perpendicular magnetic recording medium of Example 1 to Example 4, the uniaxial magnetic anisotropy (Ku) was found by a Sucksmith-Thompson Method (GST method). These results are as follows.

(X Ray Diffraction Pattern)

FIG. 3A to FIG. 3D are graphs each showing a X ray diffraction pattern in each perpendicular magnetic recording medium in Example 1 to Example 4. It is found out from any of the patterns that only diffractions from the closest-packed planes were observed and the recording medium was formed of a poly crystal thin film where the closest packed planes were arranged in parallel to the film plane. It is found out that from any of the patterns, diffractions of the $L1_1$-(111) plane due to atomic periodicity of two atomic layers were observed and the $L1_1$ type ordered structure was realized. Particularly, in each of Example 2 in which C is 10 vol % and Example 3 in which C is 20 vol %, a peak value of the super lattice diffraction of the $L1_1$-(111) plane is larger as compared to Example 1 in which C is 0 vol %.

(Saturation Magnetization and Uniaxial Magnetic Anisotropy)

Figure 4:
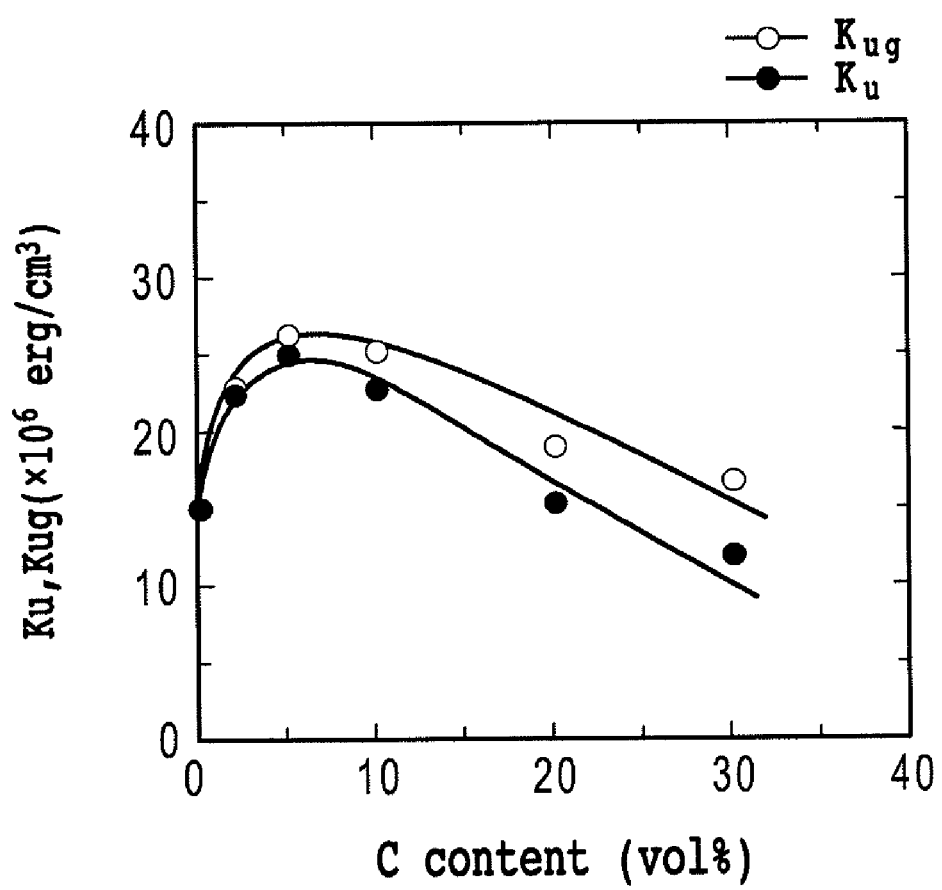
FIG. 4 is a graph showing uniaxial magnetic anisotropy Ku and Kug in the magnetic layer composed of a Co—Pt—C alloy of each perpendicular recording medium in Examples 1 to 4, wherein Kug is converted with a volume of a thin film found by subtracting a C volume rate contained in the magnetic layer.

FIG. 4 is a graph showing uniaxial magnetic anisotropy (Ku and Kug) of a magnetic layer formed of a Co—Pt—C alloy of each perpendicular magnetic recording medium in Example 1 to Example 4. In the figure, Ku shows actual uniaxial magnetic anisotropy of the magnetic layer in Example 1 to Example 4, and Kug shows uniaxial magnetic anisotropy converted by a volume of a thin film obtained by subtracting a C volume rate contained in each of Example 1 to Example 4.

In addition, as shown in FIG. 4, Ku shows the maximum value where an additional amount of C is 5 vol %, and thereafter, gradually reduces. Kug reaches the maximum value of $2.6 \times 10^7$ erg/cm$^3$ at the additional amount of C of 5 vol %. This value increases to about twice Ku in a case where C is not added in Example 1, and is becoming close to Ku ($3.7 \times 10^7$ erg/cm$^3$) of a $L1_1$ type Co—Pt thin film of a single crystal formed on the (111) plane substrate of a MgO single crystal. Accordingly, it is found out that the $L1_1$ type Co—Pt—C poly crystal thin film with addition of C of 5 vol % shows an atomic order degree ($L1_1$ type atomic arrangement ordinality) higher than that of the Co—Pt poly crystal thin film. Further, Kug maintains a value of $1.7 \times 10^7$ erg/cm$^3$ even in a case where an additional amount of C is 30 vol %. Therefore, it is found out that even in a case of C of 30 vol %, crystal grains of the Co—Pt—C poly crystal thin film are formed of a $L1_1$ type crystal structure.

The magnetic thin film according to the present invention can achieve the $L1_1$ type Co—Pt—C ordered structure and realize the excellent magnetic anisotropy (Ku). Therefore, the magnetic thin film according to the present invention is advantageous in a point of being applicable to various devices in which a large capacity process and/or a high density process are needed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A magnetic thin film containing a $L1_1$ type Co—Pt—C ordered alloy in which atoms are orderly arranged.

2. A magnetic thin film according to claim 1, wherein the magnetic thin film contains C of 50 vol % or less.

3. A magnetic thin film according to claim 1, wherein at least one of metallic elements other than Co and Pt is contained in the Co—Pt—C alloy.

4. A magnetic thin film according to claim 1, wherein the magnetic thin film is formed of a granular structure having non-magnetic grain boundaries.

5. A magnetic thin film according to claim 1, wherein an easy axis of magnetization is oriented perpendicular to a film plane.

6. A method of manufacturing the magnetic thin film on the substrate according to claim 1,
    wherein the substrate is set to a temperature of 150 to 500° C., and the magnetic thin film is formed by a highly vacuumed magnetron sputter method in which a vacuum degree prior to film forming is equal to or less than $1 \times 10^{-4}$ Pa.

7. A method of manufacturing the magnetic thin film according to claim 6, wherein the substrate is set to a temperature of 270 to 400° C.

8. A method of manufacturing the magnetic thin film according to claim 6, wherein the vacuum degree is equal to or less than $7 \times 10^{-7}$ Pa.

9. A perpendicular magnetic recording medium provided with the magnetic thin film according to claim 1.

10. A tunnel magnetic resistive element provided with the magnetic thin film according to claim 1.

11. A magnetic resistive random access memory provided with the magnetic thin film according to claim 1.

12. A micro electromechanical system device provided with the magnetic thin film according to claim 1.

* * * * *